(12) United States Patent
Fan et al.

(10) Patent No.: US 7,732,921 B2
(45) Date of Patent: Jun. 8, 2010

(54) WINDOW TYPE BGA SEMICONDUCTOR PACKAGE AND ITS SUBSTRATE

(75) Inventors: Wen-Jeng Fan, Hsinchu (TW); Yi-Ling Liu, Hsinchu (TW); Shin-Hui Huang, Hsinchu (TW); Tsai-Chuan Yu, Hsinchu (TW)

(73) Assignee: Powertech Technology Inc., Hsinchu (TW)

( * ) Notice: Subject to any disclaimer, the term of this patent is extended or adjusted under 35 U.S.C. 154(b) by 251 days.

(21) Appl. No.: 12/056,797

(22) Filed: Mar. 27, 2008

(65) Prior Publication Data
US 2009/0243099 A1 Oct. 1, 2009

(51) Int. Cl.
H01L 23/48 (2006.01)
H01L 23/52 (2006.01)
H01L 29/40 (2006.01)

(52) U.S. Cl. .................... 257/735; 257/737; 257/738; 257/E23.069

(58) Field of Classification Search ................ 257/735, 257/737, 738, 780, E23.069
See application file for complete search history.

(56) References Cited

U.S. PATENT DOCUMENTS 5,915,166 A * 6/1999 Corisis et al. ............. 438/106

* cited by examiner

Primary Examiner—Thien F Tran
(74) Attorney, Agent, or Firm—Muncy, Geissler, Olds, & Lowe, PLLC

(57) ABSTRACT

A window-type BGA semiconductor package is revealed, primarily comprising a substrate with a wire-bonding slot, a chip disposed on a top surface of the substrate, and a plurality of bonding wires passing through the wire-bonding slot. A plurality of plating line stubs are formed on a bottom surface of the substrate, connect the bonding fingers on the substrate and extend to the wire-bonding slot. The bonding wires electrically connect the bonding pads of the chip to the corresponding bonding fingers of the substrate. The plating line stubs are compliant to the wire-bonding paths of the bonding wires correspondingly connected at the bonding fingers, such as parallel to the overlapped arrangement, to avoid electrical short between the plating line stubs and the bonding wires with no corresponding relationship of electrical connections.

15 Claims, 4 Drawing Sheets

WINDOW TYPE BGA SEMICONDUCTOR PACKAGE AND ITS SUBSTRATE

FIELD OF THE INVENTION

The present invention relates to semiconductor devices, especially to a window-type BGA (Ball Grid Array) semiconductor package and its substrate.

BACKGROUND OF THE INVENTION

Window-type BGA semiconductor package is a very common semiconductor package using a substrate with a wire-bonding slot as a chip carrier. Normally, a semiconductor chip is disposed on the top surface of the substrate and a plurality of external terminals such as solder balls are disposed on the bottom surface of the substrate. Moreover, a plurality of bonding wires pass through the wire-bonding slot to electrically connect the chip and the substrate. The substrate has a plurality of bonding fingers disposed on the bottom surface thereof for wire-bonding connection. In order to enhance bondability of the bonding fingers, it is necessary to form a plating layer on bonding fingers. During substrate manufacturing processes, before forming the wire-bonding slot, a plating bus line is disposed on the bottom surface of the substrate and pass through a pre-routing area of the substrate for the wire-bonding slot to electrically connect the bonding fingers of the substrate by a plurality of plating lines. Accordingly, a substrate plating process can be worked in practice for plating Ni/Au or other metal layers on the surfaces of the bonding fingers. After plating, a wire-bonding slot is formed by routing to remove the plating bus line with the most of the plating lines. However, there are still some plating line stubs remained on the substrate connected to the bonding fingers leading to possible electrical short caused by bonding wires.

As shown in FIG. 1, a conventional window-type BGA semiconductor package 100 primarily comprises a substrate 110, a chip 120, a plurality of bonding wires 130, and an encapsulant 140. The substrate 110 has a top surface 111, a bottom surface 112, a wire-bonding slot 113, and at least a peripheral slot 117. The wire-bonding slot 113 is located at the center of the substrate 110 and the peripheral slots 117 at two opposing sides. As shown in FIG. 2, a plurality of bonding fingers 114 and a plurality of plating line stubs 115 are formed on the bottom surface 112 of the substrate 110 where the plating line stubs 115 electrically connect the bonding fingers 114 and extend to the wire-bonding slot 113. The chip 120 has a plurality of bonding pads 122 formed at the center and at the two opposing sides of the active surface of the chip 120. The active surface of the chip 120 is faced toward and attached to the top surface 111 of the substrate 110 with the bonding pads 122 aligned in the wire-bonding slot 113 and in the peripheral slots 117. The bonding wires 130 pass through the wire-bonding slot 113 and through the peripheral slot 117, respectively, to electrically connect the bonding pads 122 of the chip 120 to the bonding fingers 114 of the substrate 110. Encapsulant 140 is formed over the top surface 111 and partially formed on the bottom surface 112 of the substrate 110 to encapsulate the chip 120 and the bonding wires 130. A plurality of external terminals 150 are bonded to the external pads 116 on the bottom surface 112 of the substrate 110. As shown in FIG. 2 again, the wire-bonding slot 113 is a long and narrow through hole and the plating line stubs 115 are perpendicular to longer sides of the wire-bonding slot 113 but are oblique to the bonding wires 130 in a bottom view of the substrate 120. Moreover, some of the bonding wires 130 are too close or even overpassing the adjacent plating line stubs 115 with no relationship of electrical connections. Once the loop height of the bonding wire 130 is too low or the wire sweep of the bonding wire 130 is occurred due to molding, the bonding wires 130 electrically short with the plating line stubs 115, especially the ends of the bonding wires 130 bonded around the wire-bonding slot 113, as shown in FIG. 1 and FIG. 2, leading to electrical failure of the semiconductor package 100.

The surface layout on the substrate 110 before routing the wire-bonding slot 113 is shown in FIG. 3. A plating bus line 10 is disposed on the bottom surface 112 of the substrate 110 and passes through the wire-bonding slot 113 to connect a plurality of plating lines 11 extending from the bonding fingers 114 where the plating lines 11 are formed in parallel and are perpendicularly connected to the plating bus line 10. The substrate 110 has a pre-routing area which is removed by routing to form the wire-bonding slot 113. The portions of the plating lines 11 remained on the substrate 110 become the plating line stubs 115.

SUMMARY OF THE INVENTION

The main purpose of the present invention is to provide a window-type BGA semiconductor package and its substrate to avoid electrical short between the plating line stubs and the bonding wires with no relationship of corresponding connections leading to electrical failure of the semiconductor package.

The second purpose of the present invention is to provide a window-type BGA semiconductor package and its substrate for reducing the loop heights of the bonding wires and to avoid electrical short between the bonding wires and the plating line stubs by oblique and various designs of plating line stubs.

The third purpose of the present invention is to provide a window-type BGA semiconductor package and its substrate to decrease circuit layers of a substrate to reduce costs.

According to the present invention, a window-type BGA semiconductor package primarily comprises a substrate, a chip, and a plurality of bonding wires. The substrate has a top surface, a bottom surface, and a wire-bonding slot. The substrate includes a plurality of bonding fingers and a plurality of plating line stubs on the bottom surface where the bonding fingers are close to the wire-bonding slot and the plating line stubs are connect the bonding fingers and extend to the wire-bonding slot. The chip is disposed on the top surface of the substrate where the chip has an active surface with a plurality of bonding pads formed thereon. The active surface of the chip is faced toward and attached to the top surface of the substrate with the bonding pads aligned in the wire-bonding slot of the substrate. The bonding wires pass through the wire-bonding slot and electrically connect the bonding pads to the bonding fingers, wherein the bonding wires have a plurality of wire-bonding paths projected on the bottom surface. The plating line stubs are almost parallel to or overlapped with the wire-bonding paths of the bonding wires so that the plating line stubs are compliant to the wire-bonding paths of the bonding wires correspondingly connected at the bonding fingers. The substrate of the window-type BGA semiconductor package mentioned above is also revealed.

DETAIL DESCRIPTION OF THE INVENTION

Please refer to the attached drawings, the present invention will be described by means of embodiment below.

Figure 1:
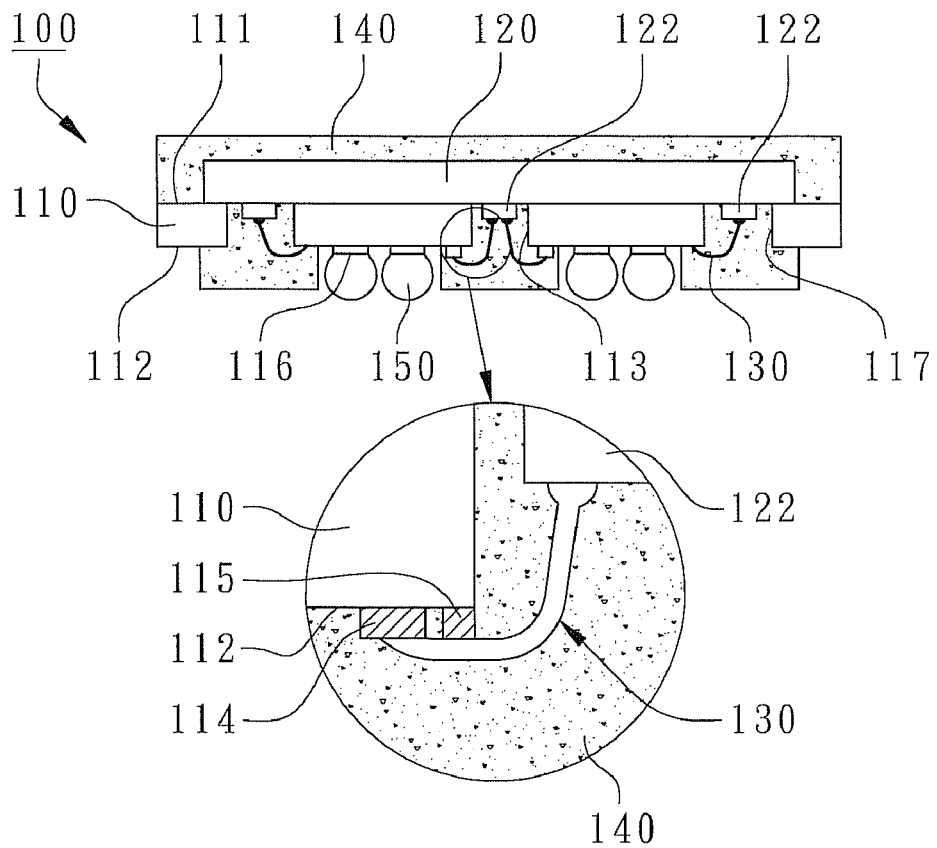
FIG. 1 shows a cross-sectional view of a conventional window-type BGA semiconductor package along one of the bonding wires.
Figure 2:
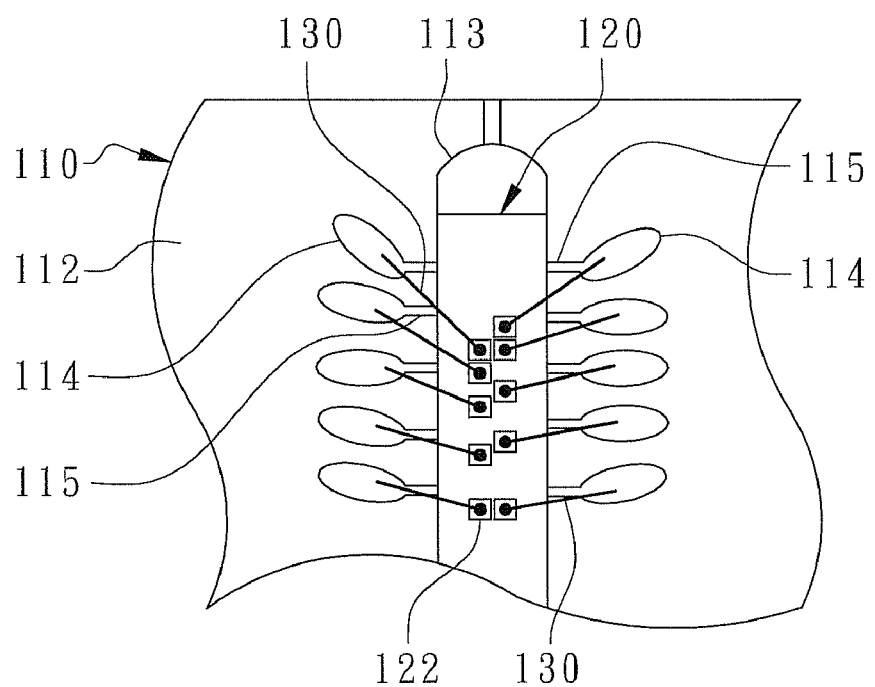
FIG. 2 shows a partial enlarged view of the bottom surface of the substrate before encapsulation of the conventional window-type BGA semiconductor package.
Figure 3:
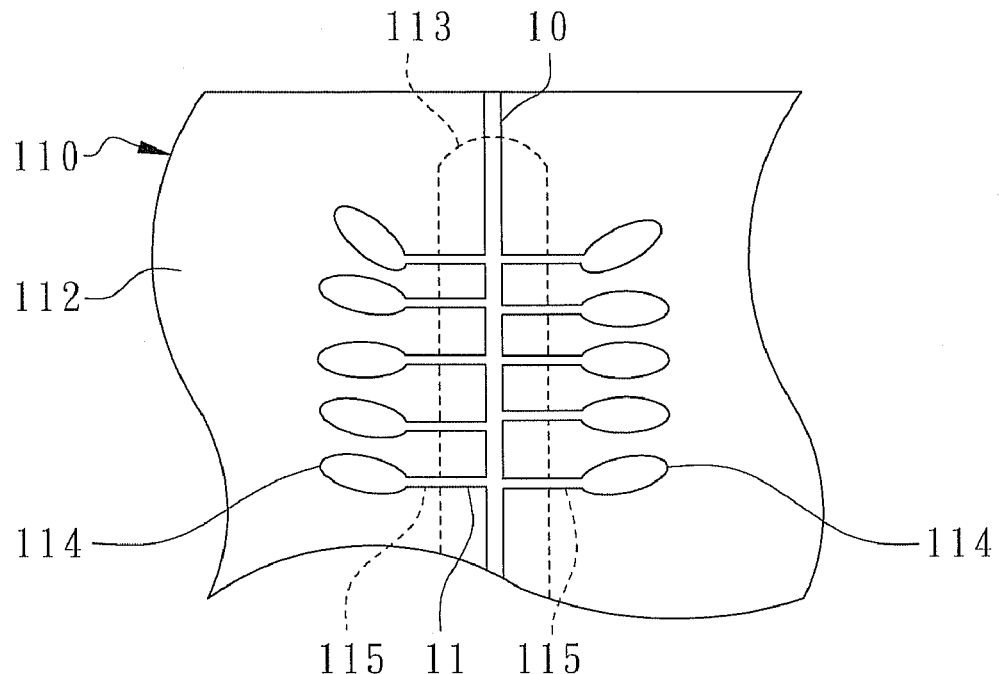
FIG. 3 shows a circuit layout on the bottom surface of the substrate of the conventional window-type BGA semiconductor package before forming a wire-bonding slot.
Figure 4:
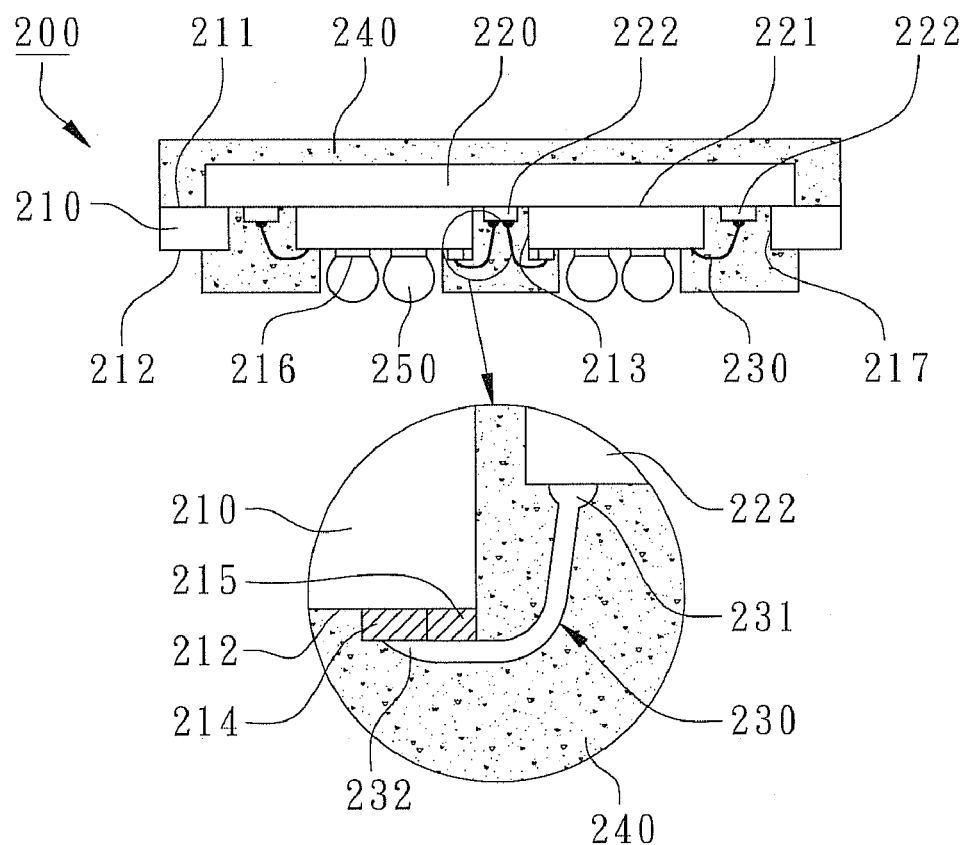
FIG. 4 shows a cross-sectional view of a window-type BGA semiconductor package along one of the bonding wires according to the preferred embodiment of the present invention.

As shown in FIG. 4, a window-type BGA semiconductor package 200 primarily comprises a substrate 210, a chip 220, and a plurality of bonding wires 230. The substrate 210 has a top surface 211, a bottom surface 212, and a wire-bonding slot 213 for passing the bonding wires 230. The top surface 211 of the substrate 210 is used for attaching the chip 220. The wire-bonding slot 213 is a long and narrow through hole located at the center area of the substrate 210 penetrating the substrate 210 from the top surface 211 to the bottom surface 212. Generally speaking, the substrate 210 is served as a chip carrier with single-layer or multiple-layer circuits such as single-layer or multiple-layer printed circuit boards.

Figure 5:
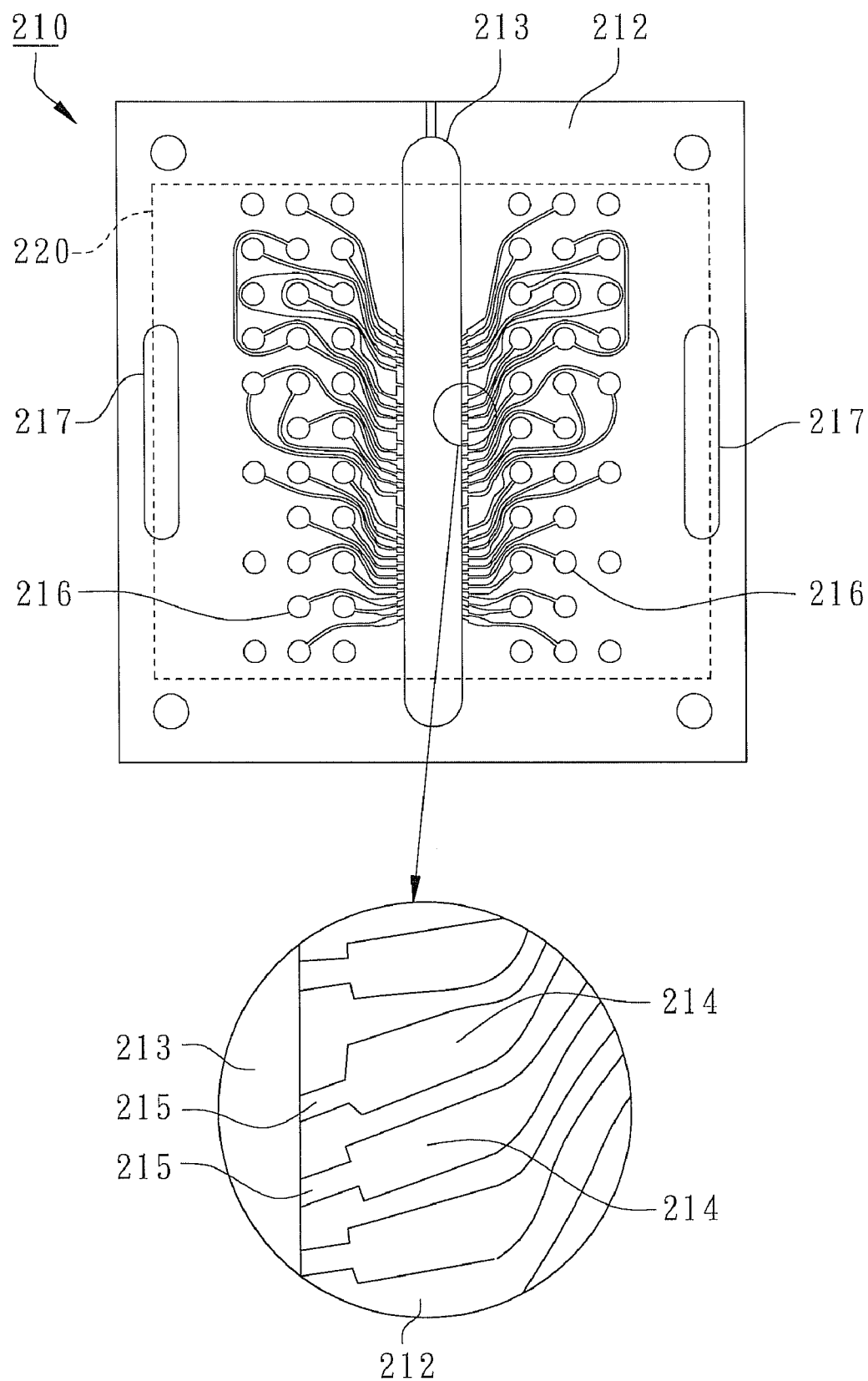
FIG. 5 shows the bottom surface of the substrate of the window-type BGA semiconductor package according to the preferred embodiment of the present invention.
Figure 6:
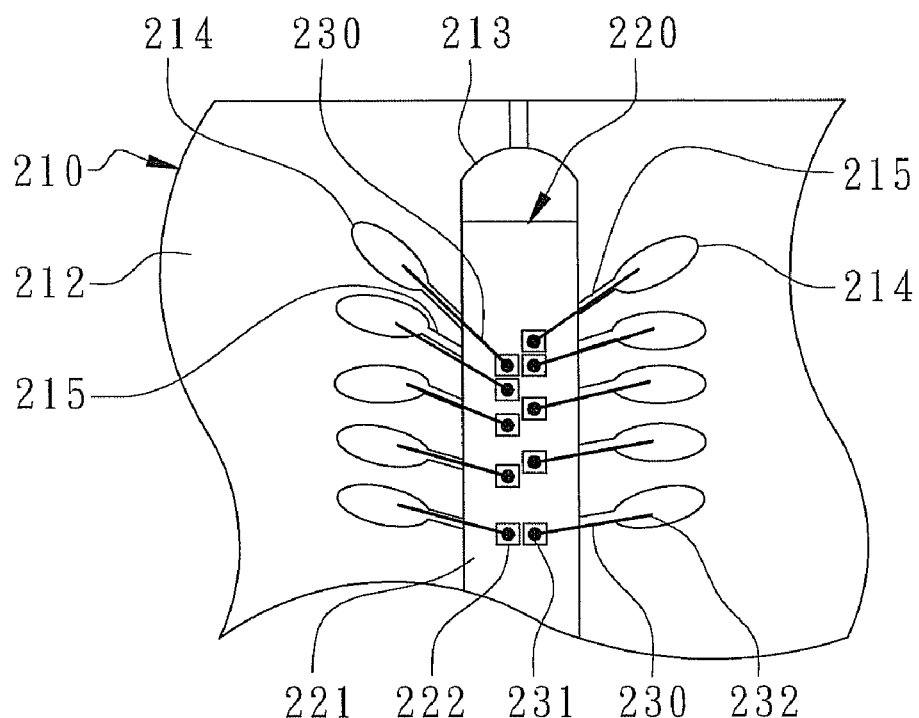
FIG. 6 shows a partial enlarged view of the bottom surface of the substrate before encapsulation of the window-type BGA semiconductor package according to the preferred embodiment of the present invention.

As shown in FIG. 5 and FIG. 6, the substrate 210 includes a plurality of bonding fingers 214 and a plurality of plating line stubs 215. The bonding fingers 214 are close to the wire-bonding slot 213. The plating line stubs 215 connect the bonding fingers 214 and extend to the wire-bonding slot 213. The plating line stubs 215 and the bonding fingers 214 are exposed from the bottom surface 212 of the substrate 210. The plating line stubs 215 are parts of the plating lines remained on the substrate 210 after forming the wire-bonding slot 213 by routing where the plating lines are used for plating before forming the wire-bonding slot 213. In the present embodiment, the plating line stubs 215 are not perpendicular to the adjacent longer sidewall of the wire-bonding slot 213. The plating line stubs 215 are not parallel to each other to be irregular with respect to the wire-bonding slot 213 of the substrate 210. To be more specific, the substrate 210 includes a plurality of external pads 216 disposed on the bottom surface 212. The external pads 216 are arranged in multiple rows or in an array. Preferably, the external pads 216 are formed of a same wiring layer with the plating line stubs 215 and the bonding fingers 214 to decrease circuit layers of the substrate 210 to reduce substrate costs. In the present embodiment, the external pads 216 are round ball pads for placing a plurality of external terminals 250 such as solder balls as the electrical connections of the window-type BGA semiconductor package 200 to an external electronic device or to an external printed circuit board. As shown in FIG. 5, to be more specific, the substrate 210 has a plurality of peripheral slots 217 located at two opposing sides of the substrate 210 and parallel to the wire-bonding slot 213.

As shown in FIG. 4, the chip 220 has an active surface 221 and a plurality of bonding pads 222 disposed on the active surface 221 where the active surface 221 of the chip 220 is faced toward and attached to the top surface 211 of the substrate 210 with the bonding pads 222 aligned in the wire-bonding slot 213. The bonding pads 222 are arranged at the center area or further at two opposing sides of the active surface 212 to be the external terminals of the chip 220. Most of the bonding pads 222 disposed at the center of the active surface 221 are arranged in a single row or multiple rows and are aligned in the wire bonding slot 213. The other of the bonding pads 222 disposed at the two opposing sides of the active surface 221 are aligned in the peripheral slots 217 of the substrate 210.

As shown in FIG. 4, the chip 220 is electrically connected to the substrate 210 by the plurality of bonding wires 230. The bonding wires 230 are formed by wire bonding bonded from the bonding pads 222 to the corresponding bonding fingers 214 passing, through the wire-bonding slot 213 and the peripheral slots 217. The bonding wires 230 have a plurality of first ends 231 bonded on the bonding pads 222 and a plurality of second ends 232 bonded on the bonding fingers 214. In the present embodiment, the first ends 231 bonded on the bonding pads 222 are ball bonds and the second ends 232 bonded on the bonding fingers 214 are stitch bonds or wedge bonds. This kind of wire bonding is called forward bonding to reduce the loop height of the bonding wires 230 leading to shorter distances and lower loop heights of the bonding wires 230 from the bottom surface 212 of the substrate 210. Additionally, as shown in FIG. 6, the bonding wires 230 have a plurality of wire-bonding paths projected on the bottom surface 212. The plating line stubs 215 extend in a manner to be compliant to the wire-bonding paths. The bonding wires 230 and the compliant plating line stubs 215 are correspondingly connected at the bonding fingers 214. Accordingly, this configuration can effectively avoid electrical short between the plating line stubs 215 and the bonding wires 230 with no corresponding relationship of electrical connections. As shown in FIG. 6 again, the compliant plating line stubs 215 are approximately parallel or overlapped with the wire-bonding paths of the corresponding bonding wires 230 to eliminate possible electrical short between the bonding wires 230 and the other plating line stubs 215 with no corresponding relationship of electrical connections. As shown in FIG. 4 again, the bonding wire 230 may electrically contact with the corresponding plating line stub 215 that is originally electrically connected to the specific bonding wire 230 through the corresponding bonding finger 214. Therefore, even the bonding wire 230 is directly contacted with the corresponding plating line stub 215, there is no issue of electrical short. The "wire-bonding paths of the bonding wires" means the horizontal lengths of the bonding wires 230 projected on the bottom surface 212 from the first ends 231 bonded to the bonding pad 222 of the chip 220 to the second ends 232 bonded to the corresponding bonding finger 214 of the substrate 210, i.e., the bottom surface 212 of the substrate 210 is served as the X-Y horizontal plane and the loop height of the bonding wires 230 displayed in Z-direction can be ignored, as shown in FIG. 6. The plating line stubs 215 are parallel to or overlapped with the straight lines drawing on the X-Y horizontal plane from the bonding pads 222 of the chip 220 to the corresponding bonding fingers 214 of the substrate 210.

As shown in FIG. 4, the window-type BCA semiconductor package 200 further comprises an encapsulant 240 formed on the top surface 211 of the substrate 210 to encapsulate the chip 220 and completely filled in the wire-bonding slot 213 and the peripheral slots 217, and partially formed on the bottom surface 212 to encapsulate the bonding wires 230, the bonding fingers 214, and the plating line stubs 215.

Figure 7:
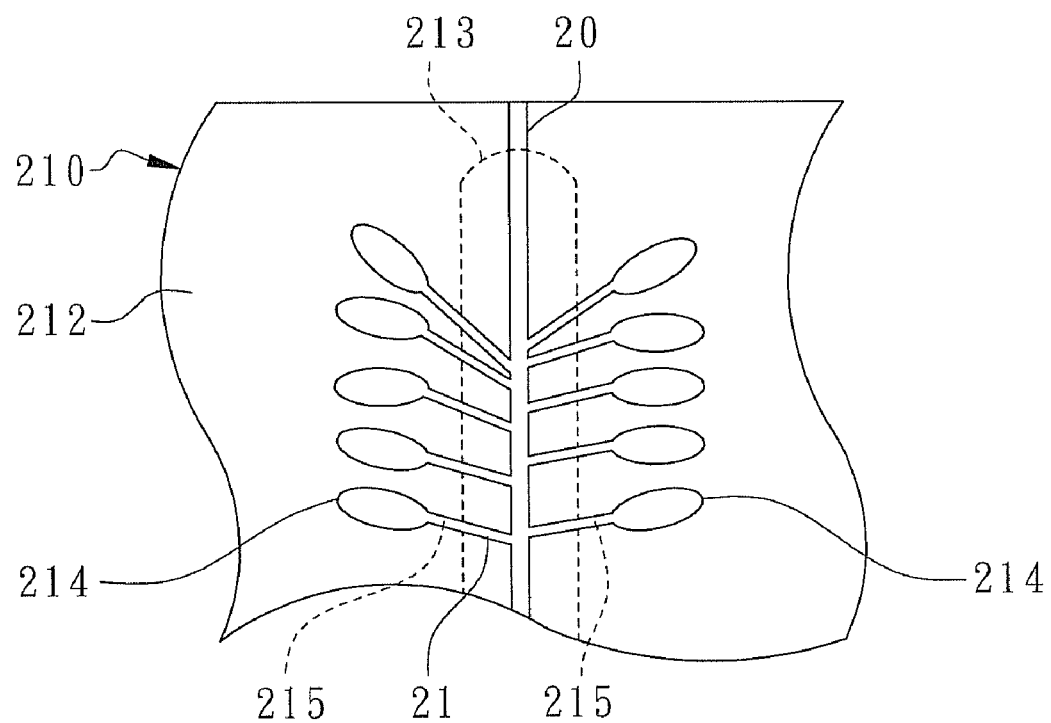
FIG. 7 shows a circuit layout of the bottom surface of the substrate of the window-type BGA semiconductor package before forming a wire-bonding slot according to the preferred embodiment of the present invention.

FIG. 7 shows a partial bottom surface 212 of the substrate 210 before forming the wire-bonding slot 213 by routing. A plating bus line 20 with a plurality of plating lines 21 pass through a pre-routing area for the wire-bonding slot 213 on the bottom surface 212 of the substrate 210. The plating lines 21 connect the bonding fingers 214 to the plating bus line 20 where the plating lines 21 are not parallel to each other nor perpendicular to but oblique to the plating bus line 20 for plating the bonding fingers 214. The pre-routing area for the wire-bonding slot 213 includes the plating bus line 20 and most portions but not the entire of the plating lines 21. By using a routing tool, not shown in the figure, the pre-routing area of the substrate 210 is removed by routing to form the wire-bonding slot 213. The portions of the plating lines 21 remaining on the substrate 210 become the plating line stubs 215. The plating line stubs 215 are irregular with respect to the wire-bonding slot 213, but are compliant to the wire-bonding paths correspondingly connected at the bonding fingers 214 to avoid electrical short with the bonding wires with no corresponding relationship of electrical connections.

The above description of embodiments of this invention is intended to be illustrative and not limiting. Other embodiments of this invention will be obvious to those skilled in the art in view of the above disclosure.

What is claimed is:

1. A window-type BGA semiconductor package primarily comprising:

a substrate having a top surface, a bottom surface, and a wire-bonding slot, wherein the substrate includes a plurality of bonding fingers and a plurality of plating line stubs on the bottom surface, wherein the bonding fingers are close to the wire-bonding slot and the plating line stubs connect the bonding fingers and extend to the wire-bonding slot;

a chip disposed on the top surface of the substrate, wherein the chip has an active surface with a plurality of bonding pads disposed on the active surface, wherein the active surface is faced toward and attached to the substrate with the bonding pads aligned in the wire-bonding slot; and a plurality of bonding wires passing through the wire-bonding slot and electrically connecting the bonding pads to the bonding fingers, wherein the bonding wires have a plurality of wire-bonding paths projected on the bottom surface;

wherein the plating line stubs extend in a manner to be compliant to the wire-bonding paths;

wherein the bonding wires and the compliant plating line stubs are correspondingly connected at the bonding fingers.

2. The semiconductor package as claimed in claim 1, wherein the compliant plating line stubs are approximately parallel to or overlapped with the wire-bonding paths of the corresponding bonding wires.

3. The semiconductor package as claimed in claim 2, wherein the compliant plating line stubs are not parallel to each other.

4. The semiconductor package as claimed in claim 1, wherein the plating line stubs are not perpendicular to the adjacent sidewall of the wire-bonding slot.

5. The semiconductor package as claimed in claim 1, wherein the plating line stubs and the bonding fingers are exposed from the bottom surface of the substrate.

6. The semiconductor package as claimed in claim 1, further comprising an encapsulant completely formed in the wire-bonding slot and partially formed on the bottom surface of the substrate to encapsulate the bonding wires, the bonding fingers, and the plating line stubs.

7. The semiconductor package as claimed in claim 6, wherein the encapsulant is further formed on the top surface of the substrate to encapsulate the chip.

8. The semiconductor package as claimed in claim 1, wherein the substrate includes a plurality of external pads disposed on the bottom surface and formed of a same wiring layer with the plating line stubs and the bonding fingers.

9. The semiconductor package as claimed in claim 8, further comprising a plurality of external terminals bonded on the external pads.

10. A substrate for window-type BGA semiconductor packages having a top surface, a bottom surface, and a wire-bonding slot, the substrate comprising a plurality of bonding fingers and a plurality of plating line stubs on the bottom surface, wherein the bonding fingers are close to the wire-bonding slot and the plating line stubs connect the bonding fingers and extend to the wire-bonding slot; when a chip having a plurality of bonding pads is disposed on the top surface of the substrate, the plating line stubs extend in a manner to be compliant to a plurality of straight lines on the bottom surface drawing from the bonding pads of the chip to the corresponding bonding fingers of the substrate.

11. The substrate as claimed in claim 10, wherein the compliant plating line stubs are parallel to or overlapped with the straight lines.

12. The substrate as claimed in claim 10, wherein the plating line stubs are not perpendicular to the adjacent sidewall of the wire-bonding slot.

13. The substrate as claimed in claim 10, wherein the plating line stubs are not parallel to each others.

14. The substrate as claimed in claim 10, wherein the plating line stubs and the bonding fingers are exposed from the bottom surface.

15. The substrate as claimed in claim 10, further comprising a plurality of external pads disposed on the bottom surface and formed of a same wiring layer with the plating line stubs and the bonding fingers.

* * * * *